(12) United States Patent
Hsiao

(10) Patent No.: US 9,013,223 B2
(45) Date of Patent: Apr. 21, 2015

(54) LEVEL CONVERSION CIRCUIT AND METHOD FOR CONVERTING VOLTAGE LEVEL THEREOF

(71) Applicant: Novatek Microelectronics Corp., Hsinchu (TW)

(72) Inventor: Sheng-Wen Hsiao, Changhua County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 14/016,249

(22) Filed: Sep. 3, 2013

(65) Prior Publication Data

US 2014/0368253 A1    Dec. 18, 2014

(30) Foreign Application Priority Data

Jun. 18, 2013  (TW) .............................. 102121591 U

(51) Int. Cl.
*H03L 5/00* (2006.01)
*H03K 19/0175* (2006.01)

(52) U.S. Cl.
CPC .............................. *H03K 19/017509* (2013.01)

(58) Field of Classification Search
USPC ............ 327/71, 108, 333; 326/63, 68, 80, 81; 365/189.11
See application file for complete search history.

(56) References Cited

U.S. PATENT DOCUMENTS 5,917,358 A * 6/1999 Sanchez et al. ................ 327/333
7,759,976 B2 * 7/2010 Ogawa ............................ 326/63

* cited by examiner

*Primary Examiner* — Long Nguyen
(74) *Attorney, Agent, or Firm* — Jianq Chyun IP Office

(57) ABSTRACT

A level conversion circuit including a first level shifter and a second level shifter is provided. The first level shifter converts a first control voltage into a second control voltage during a voltage conversion period. The second level shifter is coupled to the first level shifter. The second level shifter converts the second control voltage into a third control voltage during the voltage conversion period to control a next stage circuit. The first level shifter is configured to detect a voltage level of a power domain where the third control voltage operates and generate a plurality of middle voltages based on the detection result. The second level shifter is configured to generate the third control voltage based on the middle voltages. Furthermore, a voltage level conversion method is also provided.

19 Claims, 6 Drawing Sheets

LEVEL CONVERSION CIRCUIT AND METHOD FOR CONVERTING VOLTAGE LEVEL THEREOF

CROSS-REFERENCE TO RELATED APPLICATION

This application claims the priority benefit of Taiwan application serial no. 102121591, filed on Jun. 18, 2013. The entirety of the above-mentioned patent application is hereby incorporated by reference herein and made a part of specification.

BACKGROUND OF THE DISCLOSURE

1. Field of the Disclosure

The disclosure relates to a level conversion circuit and a method for converting voltage level thereof, and particularly to a level conversion circuit having self-bias control and a method for converting voltage level thereof.

2. Description of Related Art

Conventional level conversion circuits employ a multilevel level shifter to covert an input signal into a negative power domain from a positive power domain. Then, an output signal is outputted to a circuit to be controlled at the next stage. Here, the positive power domain is, for example, a power segment from a positive operation voltage to a ground voltage; the negative power domain is, for example, a power segment from a ground voltage to a negative operation voltage. However, in conventional application where the level conversion circuit operates when the positive power domain is converted into the negative power domain, since an electronic device within the level conversion circuit has a withstanding voltage limit for operation, that is, the difference between the maximum voltage and minimum voltage of the electronic device which operates in the power domain thereof shall not be greater than a rated voltage value, the number of required operation voltage externally supplied to the level shifter during operation needs to be taken into consideration. Meanwhile, in a power on/off procedure, the operation voltage has to be capable of accurately outputting a control signal and ensures there is no incorrect level output that causes the controlled circuit to be abnormal. In the example, if the electronic device within the level conversion circuit is a middle voltage device, a withstanding voltage limit thereof is approximately 6 volt; if it is a high voltage device, a withstanding voltage limit thereof is approximately 12 volt.

Based on the aforementioned concept, the design of a conventional level conversion circuit may be realized by the following two methods; one of which is to employ a middle voltage device within the level conversion circuit with the addition of a plurality of external voltages provided by an external circuit, wherein the external voltages includes a higher negative voltage and a lower negative voltage. In the power on/off procedure, the design of the two negative voltages is in a certain sequence so as to prevent the level shifter from outputting an incorrect level to the next stage circuit to cause abnormal current. The other method is to use a high voltage device additionally to design the level conversion circuit; however, the design requires two devices, which leads to increased costs and time needed for manufacturing process.

SUMMARY OF THE DISCLOSURE

The disclosure provides a level conversion circuit capable of self-dynamically adjusting an operation voltage and an output voltage thereof.

The disclosure provides a voltage level conversion method capable of self-dynamically adjusting an operation voltage and an output voltage of the level conversion circuit.

The disclosure provides a level conversion circuit, including a first level shifter and a second level shifter. The first level shifter coverts a first control voltage into a second control voltage during a voltage conversion period. The first control voltage is between a first voltage and a second voltage. The second control voltage is between a first middle voltage and a second middle voltage. The second level shifter is coupled to the first level shifter for converting the second control voltage into a third control voltage during the voltage conversion period to control a next stage circuit. The third control voltage is between the first middle voltage and the third voltage. The first level shifter detects the third voltage and generates a plurality of middle voltages based on a detection result. The middle voltages include a middle voltage, a second middle voltage, and a third middle voltage. The second level shifter generates the third control voltage based on the middle voltages.

The disclosure provides a voltage level conversion method adaptable for a level conversion circuit. The voltage level conversion method includes the following steps. A first control voltage is converted into a second control voltage during a voltage conversion period. The first control voltage is between a first voltage and a second voltage. The second control voltage is between a first middle voltage and a second middle voltage. The second control voltage is converted into a third control voltage during the voltage conversion period to control a next stage circuit of the level conversion circuit. The third control voltage is between the first middle voltage and a third voltage. Before the step of converting the second control voltage into the third control voltage, the voltage level conversion method further includes the following steps. The third voltage is detected, and a plurality of middle voltages is generated based on a detection result. The middle voltage includes a first middle voltage, a second middle voltage, and a third middle voltage. In the step of converting the second control voltage into the third control voltage, the third control voltage is generated based on the middle voltages.

In an embodiment of the disclosure, the voltage conversion period includes a first conversion period. During the first conversion period, the third voltage is greater than or equal to a threshold level.

In an embodiment of the disclosure, during the first conversion period, the third middle voltage remains substantially the same, and the first middle voltage remains substantially the same or gradually rises or drops in response to the third voltage. The second middle voltage rises or drops in response to the third voltage.

In an embodiment of the disclosure, during the first conversion period, the first middle voltage is greater than the second middle voltage, and the second middle voltage is greater than the third voltage.

In an embodiment of the disclosure, the voltage conversion period includes a second conversion period; during the second conversion period, the third voltage is less than the threshold level and greater than a rated voltage level.

In an embodiment of the disclosure, during the second conversion period, the third middle voltage remains substantially the same. The first middle voltage and the second middle voltage gradually rise or drop in response to the third voltage.

In an embodiment of the disclosure, during the second conversion period, the third middle voltage is greater than the first middle voltage. The first middle voltage is greater than the second middle voltage. The second middle voltage is greater than the third voltage.

In an embodiment of the disclosure, the voltage conversion period includes a third conversion period. During the third conversion period, the third voltage is converted into a rated voltage level.

In an embodiment of the disclosure, during the third conversion period, the first middle voltage, the second middle voltage and the third middle voltage remain substantially the same.

In an embodiment of the disclosure, during the third conversion period, the third middle voltage is greater than the first middle voltage. The first middle voltage is greater than the second middle voltage. The second middle voltage is greater than the third voltage.

In an embodiment of the disclosure, a difference between the third middle voltage and the second middle voltage is less than a withstanding voltage bearable for the level conversion circuit. A difference between the first middle voltage and the third voltage is less than a withstanding voltage bearable for the level conversion circuit.

In an embodiment of the disclosure, the first level shifter includes a first voltage generating circuit, a voltage detecting circuit, and a second voltage generating circuit. The first voltage generating circuit generates the third middle voltage based on the first voltage and the second voltage. The voltage detecting circuit is coupled to the first voltage generating circuit for detecting the third voltage to generate a detection result. The voltage detecting circuit generates the first middle voltage in cooperation with the first voltage generating circuit based on the third middle voltage and the detection result. The second voltage generating circuit is coupled to the first voltage generating circuit to generate the second middle voltage based on the first middle voltage and the third voltage.

In an embodiment of the disclosure, the first voltage is greater than the second voltage; the second voltage is greater than the third voltage.

Based on the aforementioned, in the exemplary embodiments of the disclosure, the first level shifter may be used to detect the third voltage to generate a plurality of middle voltages based on the detection result. Therefore, the level conversion circuit is capable of self-dynamically adjusting the operation voltage and output voltage thereof.

In order to make the aforementioned features and advantages of the disclosure more comprehensible, embodiments accompanying figures are described in detail below.

DESCRIPTION OF EMBODIMENTS

In an exemplary embodiment of the disclosure, a level conversion circuit includes a voltage detecting circuit for detecting a voltage level in a power domain where an output signal operates. The level conversion circuit uses the voltage detecting circuit to automatically adjust an operation voltage and a voltage level of the output signal thereof required by each stage level shifter based on the detected voltage level dynamically, so that a device with low withstand voltage is used to realize the function of converting the voltage level. In the disclosure, a lowest negative voltage level in a negative power domain where the output signal operates is used as an example to be detected by the voltage detecting circuit for the purpose of giving an exemplary description, which should not be construed as a limitation to the disclosure. In order to make the disclosure to be more comprehensible, at least one exemplary embodiment accompanying drawing is provided as follows for description.

Figure 1:
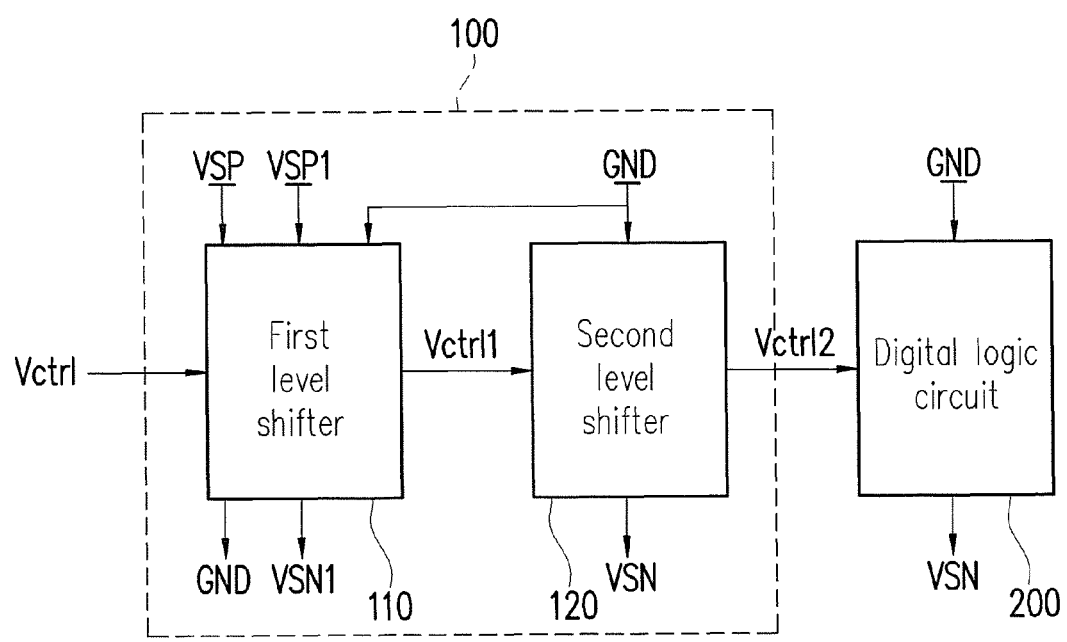
FIG. 1 is a schematic block diagram illustrating a level conversion circuit of a relevant technique in the disclosure.
Figure 2:
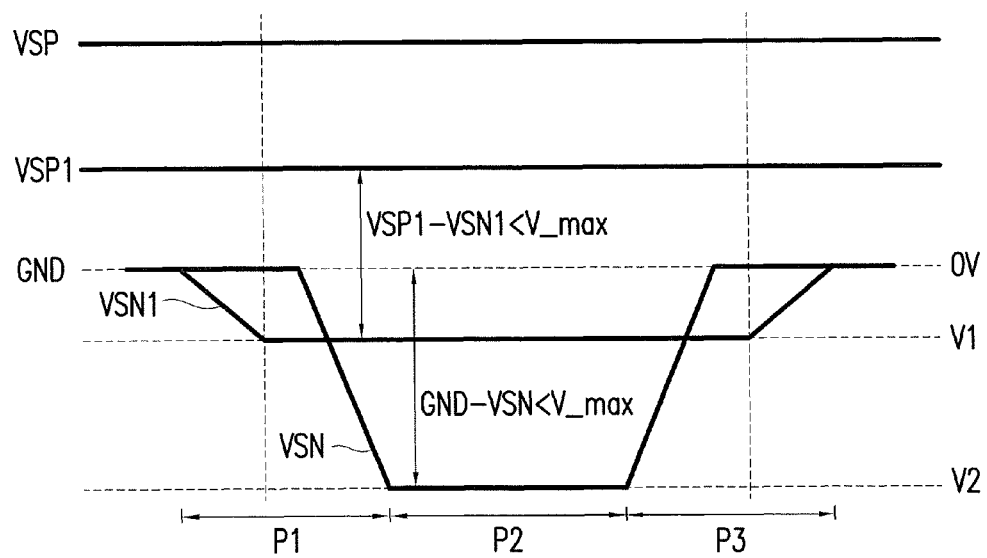
FIG. 2 is a schematic waveform illustrating each voltage signal in the level conversion circuit in FIG. 1.

FIG. 1 is a schematic block diagram illustrating a level conversion circuit of a relevant technique in the disclosure. FIG. 2 is a schematic waveform illustrating each voltage signal in the level conversion circuit in FIG. 1. Please refer to FIGS. 1 and 2. The level conversion circuit 100 in the embodiment includes two level shifters, which are a first level shifter 110 and a second level shifter 120, respectively. The first level shifter 110 receives a first control signal Vctrl, and performs level adjustment to the first control signal Vctrl, based on which a second control signal Vctrl1 is outputted. Thereafter, the second level shifter 120 receives the second control signal Vctrl1 and performs level adjustment to the second control signal Vctrl1, based on which a third control signal Vctrl2 is outputted to a next stage circuit 200. The next stage circuit 200 is, for example, a digital logic circuit including a middle voltage device. In the embodiment, the first control signal Vctrl used as the input signal operates in a positive power domain between a first voltage VSP and a second voltage GND; the third control signal Vctrl2 used as the output signal operates in a negative power domain between the second voltage GND and the third voltage VSN.

Compared with the embodiment of the disclosure, in relevant techniques, the third middle voltage VSP1 is a positive voltage with a level between the first voltage VSP and the second voltage GND, which may be generated by the first voltage VSP. The second middle voltage VSN1 is a negative voltage less than the second voltage GND. In a power on procedure P1, a normal operation procedure P2, and a power off procedure P3, the level conversion circuit 100 has to ensure that the operation voltage within the first level shifter 110 and the second level shifter 120 does not exceed a withstanding voltage maximum V_max of the middle voltage device. Here, the operation voltage includes a difference VSP1-VSN1 between the third middle voltage VSP1 and the second middle voltage VSN1, a difference GND-VSN1 between the second voltage GND and the second middle voltage VSN1, and a difference GND-VSN between the second voltage GND and the third voltage VSN. Therefore, in the power on procedure P1, the second middle voltage VSN1 has to achieve a target voltage V1 before the third voltage VSN achieves a target voltage V2 thereof. Also, in the power off procedure P3, the second middle voltage VSN1 has to achieve the target voltage after the third voltage VSN achieves the target voltage, so as to ensure that the second control signal Vctrl1 can control the second level shifter 120 normally and to prevent an incorrect signal from being inputted into the second level shifter 120 to cause abnormal current in the second level shifter 120. In the power off procedure P3, the target voltage for both of the second middle voltage VSN1 and the third voltage VSN is 0 volt.

In the embodiment, an external circuit (not shown) of the level conversion circuit 100 has to provide the first voltage VSP, the third middle voltage VSP1, and the third voltage VSN. Meanwhile, the second middle voltage VSN1 is a negative voltage higher than the third voltage VSN. As mentioned before, in the power on/off procedures P1 and P3, the second middle voltage VSN1 and the third voltage VSN are in a predetermined sequence so as to prevent the level shifter from outputting an incorrect level to the next stage circuit and causing abnormal current.

Figure 3:
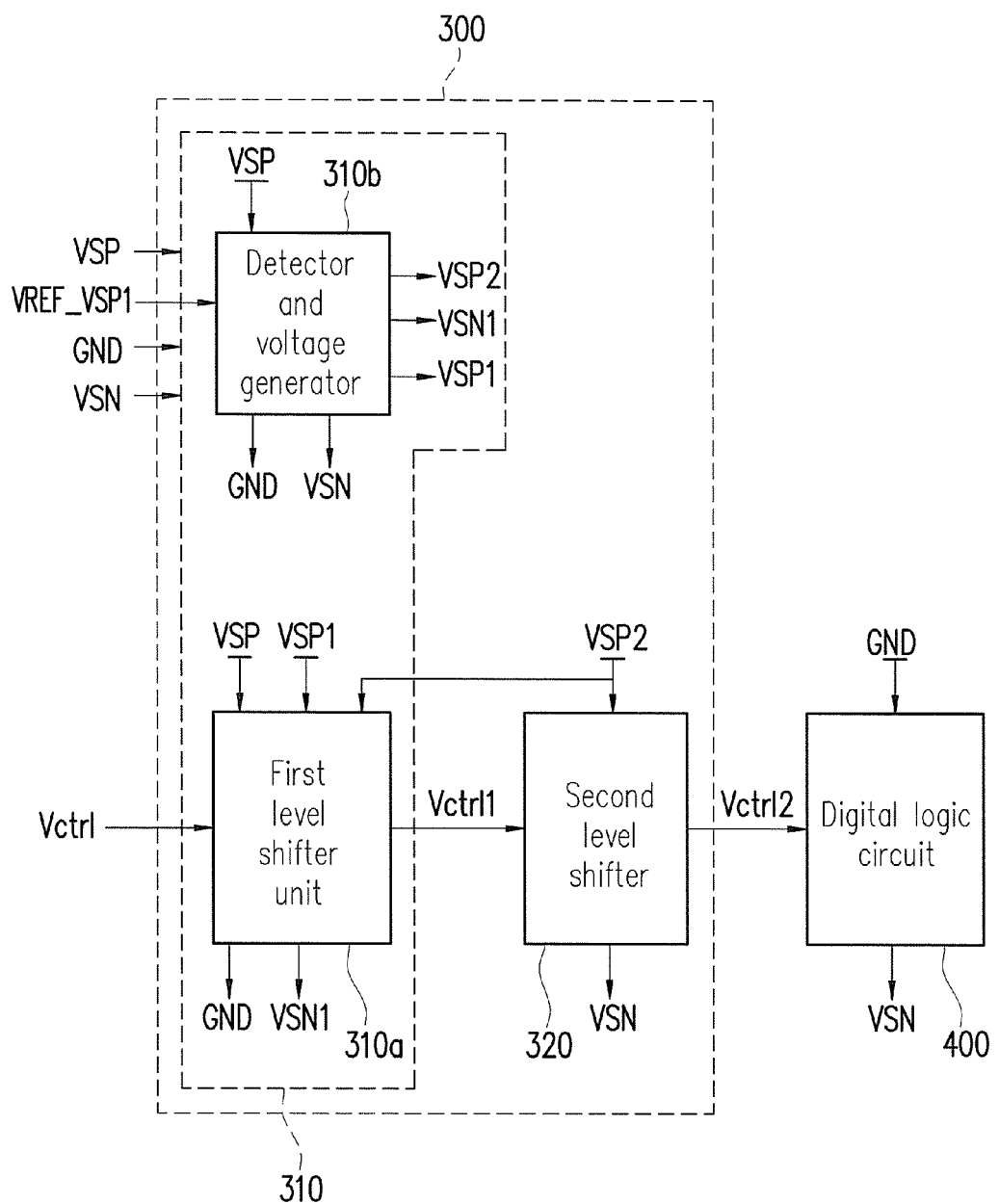
FIG. 3 is a schematic block diagram illustrating a level conversion circuit in an embodiment of the disclosure.
Figure 4:
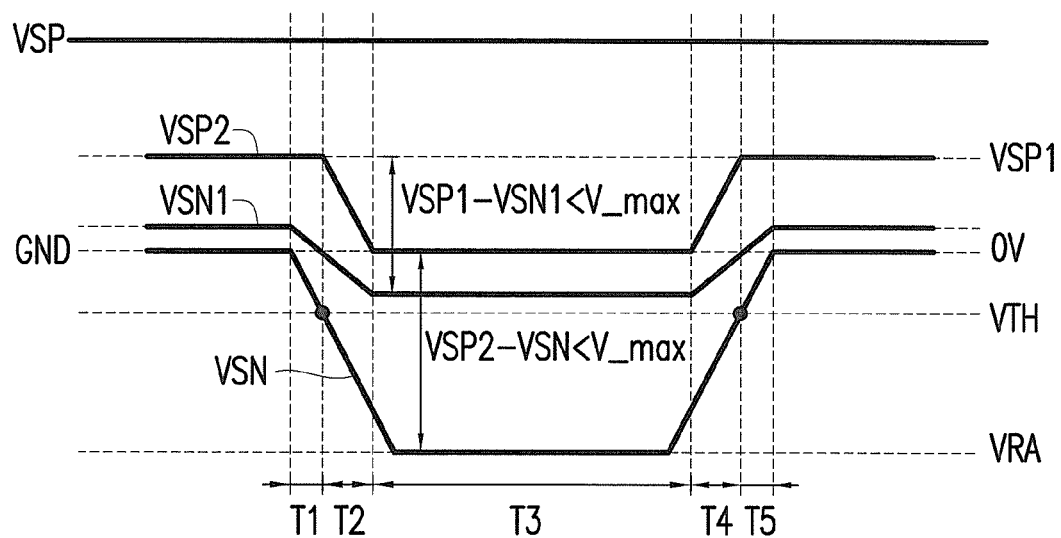
FIG. 4 is a schematic waveform illustrating each voltage signal in the level conversion circuit in FIG. 3.

FIG. 3 is a schematic block diagram illustrating a level conversion circuit in an embodiment of the disclosure. FIG. 4 is a schematic waveform illustrating each voltage signal in the level conversion circuit in FIG. 3. Please refer to both FIGS. 3 and 4. The level conversion circuit 300 in the embodiment includes a first level shifter 310 and a second level shifter 320, wherein the first level shifter 310 includes a first level shifter unit 310a and a detector and voltage generator 310b. The first level shifter 310 converts a first control voltage Vctrl into a second control voltage Vctrl1 during a voltage conversion period. Here, the first voltage VSP and the second voltage GND bias the first level shifter 310, allowing which to operate in the positive power domain, that is, between the first voltage VSP and the second voltage GND. Therefore, the input signal Vctrl received by the first level shifter 310 operates between the first voltage VSP and the second voltage GND. In the meantime, during the voltage conversion period, the first level shifter 310 detects the level variation of the third voltage VSN and generates a plurality of middle voltages based on the detection result. Here, the middle voltage includes a first middle voltage VSP2, a second middle voltage VSN1, and a third middle voltage VSP1 as shown in FIG. 4.

In the embodiment, based on the detection result of the first level shifter 310, the first middle voltage VSP2 and the second middle voltage VSN1 are adjusted in response to the change of the third voltage VSN to realize the function of self-dynamically adjusting operation voltage and output voltage. In addition, in the embodiment, due to the influence of being biased by the first middle voltage VSP2 and the second middle voltage VSN1, the second control voltage Vctrl1 outputted from the first level shifter 310 operates between the first middle voltage VSP2 and the second middle voltage VSN1.

Apart from that, the voltage conversion period in the embodiment includes a first conversion period T1 and T5, a second conversion period T2 and T4, and a third conversion period T3 as shown in FIG. 4. In comparison with relevant embodiments disclosed in FIG. 1, the power on procedure P1 in the embodiment includes a first conversion period T1 and the second conversion period T2. The normal operation procedure P2 includes a third conversion period T3. The power off procedure P3 includes the second conversion period T4 and the first conversion period T5. During the voltage conversion period, basically the level relation among the first middle voltage VSP2, the second middle voltage VSN1, and the third middle voltage VSP1 is that the third middle voltage VSP1 is greater than the first middle voltage VSP2, and the first middle voltage VSP2 is greater than the second middle voltage VSN1 so as to ensure that the operation voltage within the first level shifter 310 and the second level shifter 320 does not exceed the withstanding voltage maximum V_max of the middle voltage device. However, during the first conversion period T1 and T5, the third middle voltage VSP1 may be substantially equal to the first middle voltage VSP2.

Subsequently, the second level shifter 320 is coupled to the first level shifter 310 for converting the second control voltage Vctrl1 into a third control voltage Vctrl2 during the voltage conversion period so as to control a next stage circuit 400. Meanwhile, the second level shifter 320 also generates the third control voltage Vctrl2 according to the middle voltage generated by the first level shifter 310. In the embodiment, the first middle voltage VSP2 and the third voltage VSN bias the second level shifter 320, allowing which to operate in the negative power domain during the third conversion period T3. Thus, the third control voltage Vctrl2 outputted by the second level shifter 320 is between the first middle voltage VSP2 and the third voltage VSN.

Figure 5:
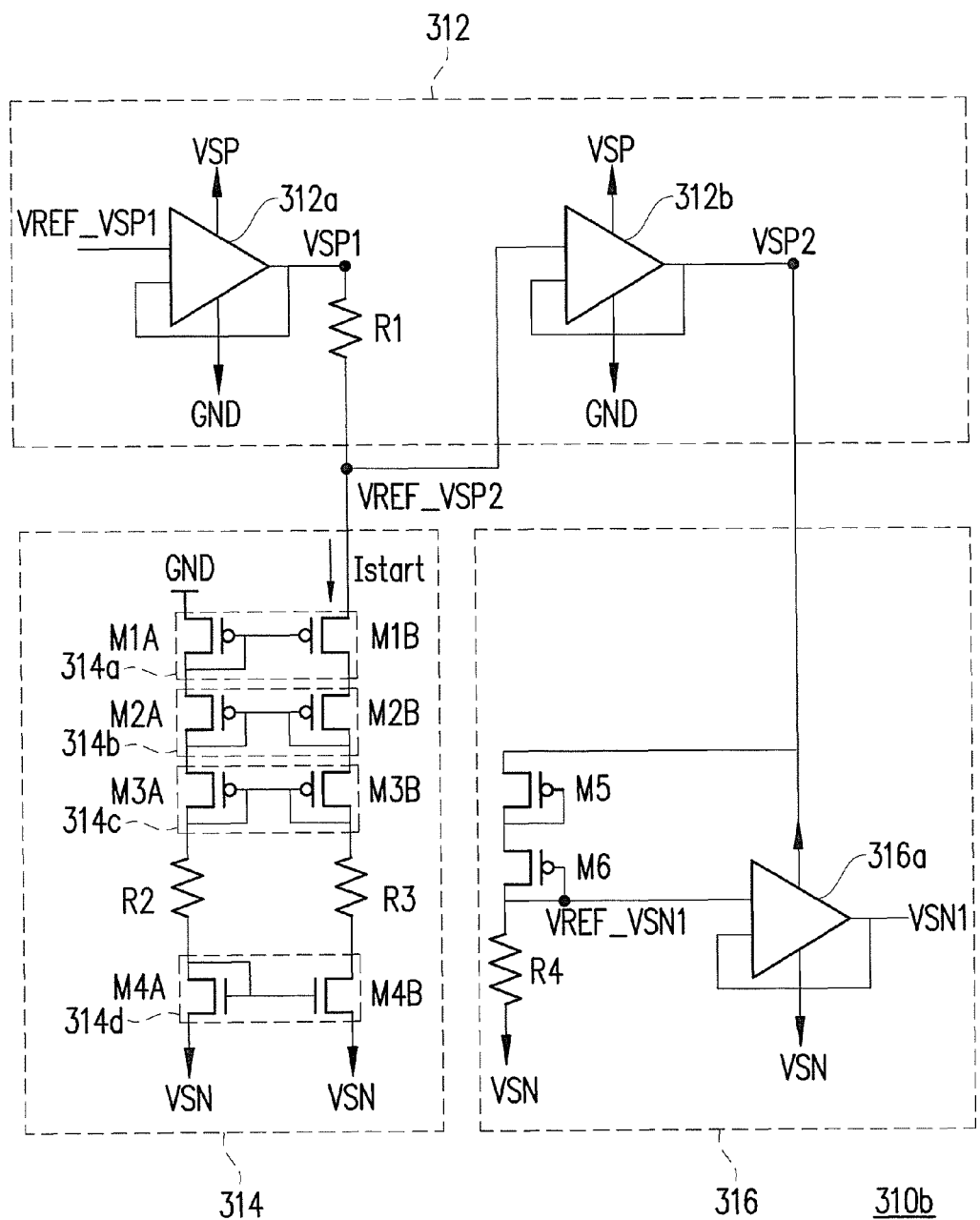
FIG. 5 is a partial circuit diagram illustrating a first level shifter in an embodiment in FIG. 3.

Specifically, FIG. 5 is a partial circuit diagram of a first level shifter in an embodiment in FIG. 3. In detail, FIG. 5 is the detector and voltage generator 310b of the first level shifter 310 of FIG. 3. Please refer to FIGS. 3-5. The detector and voltage generator 310b in the embodiment includes a first voltage generating circuit 312, a voltage detecting circuit 314, and a second voltage generating circuit 316. The first voltage generating circuit 312 generates a third middle voltage VSP1 based on the first voltage VSP and the second voltage GND. The voltage detecting circuit 314 is coupled to the first voltage generating circuit 312 for detecting the third voltage VSN to generate a detection result. In the embodiment, the voltage detecting circuit 314 works in cooperation with the first voltage generating circuit 312, and both of them generate the first middle voltage VSP2 based on the third middle voltage VSP1 and the detection result. The second voltage generating circuit 316 is coupled to the first voltage generating circuit 312 for generating the second middle voltage VSN1 based on the first middle voltage VSP2 and the third middle voltage VSP1.

Specifically, the first voltage generating circuit 312 in the embodiment includes a first buffer 312a and a second buffer 312b. The first buffer 312a is configured as a voltage follower to be implemented, which is biased between the first voltage VSP and the second voltage GND. An input end of the first buffer 312a receives a first reference voltage VREF_VSP1, and an output end outputs the third middle voltage VSP1 to one end of a resistor R1. Moreover, the second buffer 312b in the embodiment is also configured as a voltage follower to be implemented, and is biased between the first voltage VSP and the second voltage GND. An input end of the second buffer 312b is coupled to another end of the resistor R1 to receive a second reference voltage VREF_VSP2, based on which the second buffer 312b outputs the first middle voltage VSP2 to the second voltage generating circuit 316 at the output end thereof.

In the embodiment, a voltage detecting circuit 314 includes a plurality of cascade mirrors 314a to 314d and resistors R2 and R3. The mirrors 314a to 314d detect the level variation of the third voltage VSN and show the detection result in the form of a variation of a current Istart. Therefore, in response to the level variation of the third voltage VSN, the voltage detecting circuit 314 drains the current Istart from the first buffer 312a, and then generates the second reference voltage VREF_VSP2 at the input end of the second buffer 312b in cooperation with the first buffer 312a and the resistor R1.

It should be noted that the first voltage generating circuit 312 in the embodiment is exemplified by including two buffers, which should not be construed as a limitation to the disclosure. In other embodiments, the first voltage generating circuit 312 may be configured without the second buffer 312b; in which case, the voltage detecting circuit 314 generates the first middle voltage VSP2 in cooperation with the first buffer 312a and the resistor R1, and directly outputs the first middle voltage VSP2 to the second voltage generating circuit 316 without transmitting it to the second voltage generating circuit 316 via the second buffer 312b.

Meanwhile, in the embodiment, the second voltage generating circuit 316 includes a third buffer 316a, cascade transistors M5 and M6, and a resistor R4. The third buffer 316a is configured as a voltage follower to be implemented and is biased between the first middle voltage VSP2 and the third voltage VSN. An input end of the third buffer 316a receives the third reference voltage VREF_VSN1, and an output end outputs the second middle voltage VSN1 to a next stage circuit. An end of the cascade transistors M5 and M6 is coupled to a bias path of the third buffer 316a, and another end thereof is coupled to an input end of the third buffer 316a. An end of the resistor R4 is coupled to an input end of the third buffer 316a, and another end thereof is coupled to the third voltage VSN.

Thereafter, an operation method of the first level shifter 310 in the embodiment performed in the power on procedure, the normal operation procedure, and the power off procedure is described in the following paragraph. Meanwhile, the variation of each voltage signal in different procedures is also described. Still, please to refer to FIGS. 3-5.

Before the level conversion circuit 300 enters the power on procedure, the third voltage VSN is 0 volt. At this time, the first middle voltage VSP2 is equal to the second reference voltage VREF_VSP2. The second reference voltage VREF_VSP2 is equal to the third middle voltage VSP1; that is, VSP2=VREF_VSP2=VSP1. Moreover, the second middle voltage VSN1 is equal to the third reference voltage VREF_VSN1; the third reference voltage VREF_VSN1 is equal to that the first middle voltage VSP2 minus N1 of turn on voltage Vov; that is, VSN1=VREF_VSN1=VSP2−N1×Vov. In the implementation mode in FIG. 5, Vov is, for example, a turn on voltage of the transistor M5 and M6; also, N1=2.

Subsequently, when it proceeds to the first conversion period T1 of the power on procedure, the third voltage VSN starts to drop. During the period, the third voltage VSN is still greater than or equal to a threshold level VTH. In the meantime, the second middle voltage VSN1 gradually drops in response to the third voltage VSN; the third middle voltage VSP1 remains substantially the same during the period. In addition, the first middle voltage VSP2 remains substantially the same or gradually drops in response to the third voltage VSN. In the embodiment, the first middle voltage VSP2 remains the same and is equal to the third middle voltage VSP1. However, in other embodiments, the first middle voltage VSP2 may be designed to not to equal to the third middle voltage VSP1. At least, in order to ensure that the operation voltage within the level conversion circuit 300 does not exceed the withstanding voltage maximum V_max of the middle voltage device, during the first conversion period T1, the first middle voltage VSP2 is greater than the second middle voltage VSN1, and the second middle voltage VSN1 is greater than the third voltage VSN.

Next, when it proceeds to the second conversion period T2 of the power on procedure, the third voltage VSN is less than a threshold level VTH and greater than a rated voltage level VRA. Here, the threshold level VTH, in terms of the implementation mode in FIG. 5, has a value of −N2×Vov, wherein the Vov refers to, for example, the turn on voltage of the transistor of each mirror. Furthermore, in the embodiment, N2=4. During the second conversion period T2, when the third voltage VSN is less than the threshold level VTH, the voltage detecting circuit 314 starts to drain the current Istart from the first buffer 312a. As the third voltage VSN keeps dropping toward the rated voltage level VRA, the first middle voltage VSP2 and the second middle voltage VSN1 gradually drop in response to the third voltage VSN, wherein the first middle voltage VSP2 gradually drops beginning from the third middle voltage VSP1 until it is clamped at the second voltage GND by mirrors 314a to 314d. At least, in order to ensure that, in the level conversion circuit 300, the operation voltage within the first level shifter 310 and the second level shifter 320 does not exceed the withstanding voltage maximum V_max of the middle voltage device, during the second conversion period T2, the third middle voltage VSP1 is greater than the first middle voltage VSP2, the first middle voltage VSP2 is greater than the second middle voltage VSN1, and the second middle voltage VSN1 is greater than the third voltage VSN. Additionally, during the second conversion period T2, the third middle voltage VSP1 remains substantially the same.

Subsequently, the level conversion circuit 300 enters the normal operation procedure. During the third conversion period T3, the third voltage VSN is converted into the rated voltage level VRA. During the third conversion period T3, the first middle voltage VSP2, the second middle voltage VSN1, and the third middle voltage VSP1 remain substantially the same. At least, in order to ensure that the operation voltage within the level conversion circuit 300 does not exceed the withstanding voltage maximum V_max of the middle voltage device, during the third conversion period T3, the third middle voltage VSP1 is greater than the first middle voltage VSP2, the first middle voltage VSP2 is greater than the second middle voltage VSN1, and the second middle voltage is greater than the third voltage VSN.

Thereafter, the level conversion circuit 300 enters the power off procedure. The third voltage VSN gradually rises to the second voltage GND from the rated voltage level VRA. During the second conversion period T4 in the power off procedure, the third voltage VSN is less than the threshold level VTH and greater than the rated voltage level. During the second conversion period T4, the third middle voltage VSP1 remains substantially the same. The first middle voltage VSP2 and the second middle voltage VSN1 gradually rise in response to the third voltage VSN. Likewise, at least for ensuring that the operation voltage within the level conversion circuit 300 does not exceed the withstanding voltage maximum V_max of the middle voltage device, during the second conversion period T4, the third middle voltage VSP1 is greater than the first middle voltage VSP2, the first middle voltage VSP2 is greater than the second middle voltage VSN1, and the second middle voltage VSN1 is greater than the third voltage VSN.

During the first conversion period T5 of the power off procedure, the third voltage VSN is greater than or equal to the threshold level VTH. During the first conversion period T5, the third middle voltage VSP1 remains substantially the same; the first middle voltage VSP2 remains substantially the same or gradually rises in response to the third voltage VSN. The second middle voltage VSN1 gradually rises in response to the third voltage VSN. In the embodiment, the first middle voltage VSP2 remains the same and is equal to the third middle voltage VSP1. However, in other embodiments, the first middle voltage VSP2 may be designed to be unequal to the third middle voltage VSP1. Likewise, at least for ensuring the operation voltage within the level conversion circuit 300 does not exceed the withstanding voltage maximum V_max of the middle voltage device, during the first conversion period T5, the third middle voltage VSP1 is greater than or equal to the first middle voltage VSP2. The first middle voltage VSP2 is greater than the second middle voltage VSN1. The second middle voltage VSN1 is greater than the third voltage VSN.

It should be noted that, in the embodiment, the first middle voltage VSP2 and the second middle voltage VSN1 gradually rise or drop as the third voltage VSN changes, which means that the first middle voltage VSP2 and the second middle voltage VSN1 gradually rise or drop toward a predetermined voltage level based on a fixed slope. Moreover, the slope based on which each voltage rises or drops during different periods may be the same or different. Besides, although the operation method of the first level shifter 310 in the embodiment performed during the power on procedure, normal operation procedure, and power off procedure is exemplified accompanying the circuit structure disclosed in FIG. 5, the disclosure is not limited thereto. Sufficient teaching, advice, and implementation are also available with the illustration in the schematic block diagram in FIG. 3; thus, nor further description is incorporated herein.

Figure 6:
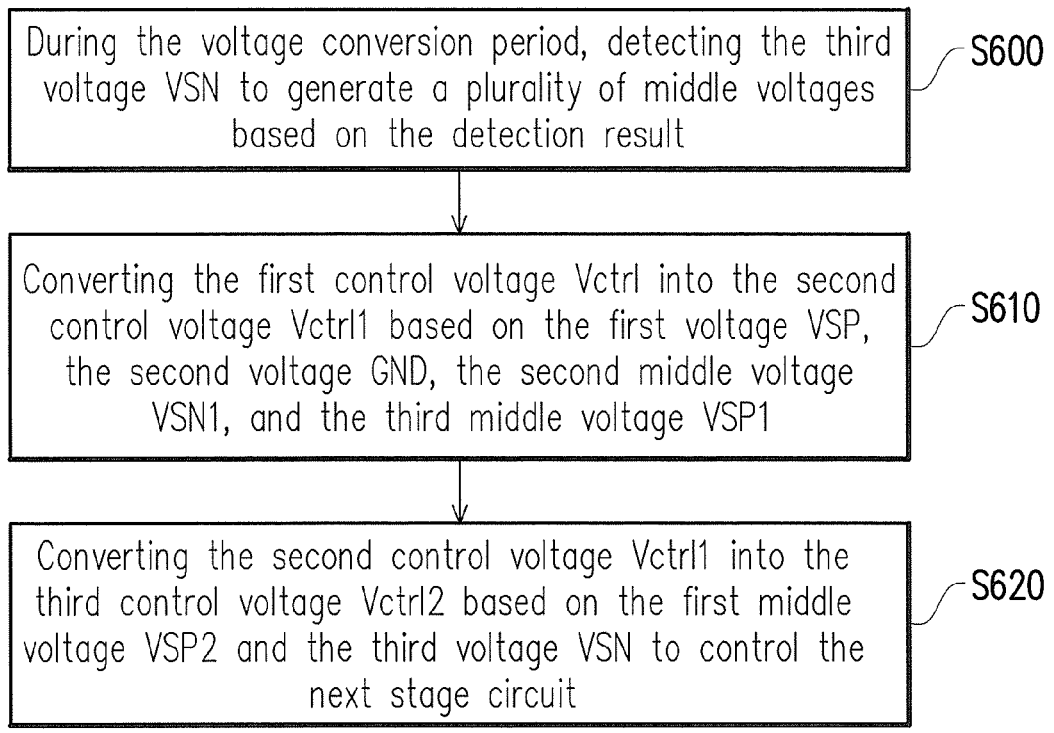
FIG. 6 is a process flowchart illustrating a voltage level conversion method in an embodiment of the disclosure.

FIG. 6 is a process flowchart illustrating a voltage level conversion method in an embodiment of the disclosure. Please refer to FIGS. 3-6. The voltage level conversion method in the embodiment is adaptable at least for the level conversion circuit disclosed in the aforementioned embodiments, including the following steps. First of all, in step S600, during the voltage conversion period, the first level shifter 310 detects the third voltage VSN and generates a plurality of middle voltages based on the detection result. Here, the middle voltage includes a first middle voltage VSP2, a second middle voltage VSN1, and a third middle voltage VSP1. Then, in step S610, the first level shifter 310 converts the first control voltage Vctrl into the second control voltage Vctrl1 based on the first voltage VSP, the second voltage GND, the second middle voltage VSN1, and the third middle voltage VSP1. Thereafter, in step S620, the second level shifter 320 converts the second control voltage Vctrl1 into the third control voltage Vctrl2 based on the first middle voltage VSP2 and the third voltage VSN so as to control the next stage circuit 400 of the level conversion circuit 300.

In addition, sufficient teaching, advice, and implementation concerning the voltage level conversion method in the embodiment of the disclosure are available from the illustration of embodiments in FIGS. 3-5. Therefore, no further description is incorporated herein.

In summary, in the exemplary embodiments of the disclosure, the voltage detecting circuit of the level conversion circuit detects the voltage level of the power domain where the output signal operates. The voltage detecting circuit automatically adjusts the operation voltage and the voltage level of the output signal required by each stage level shifter based on the detected voltage level dynamically, so that a device with lower withstanding voltage is used to realize the function of converting the voltage level.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A level conversion circuit, comprising:
a first level shifter, converting a first control voltage into a second control voltage during a voltage conversion period, wherein the first control voltage is between a first voltage and a second voltage, and the second control voltage is between a first middle voltage and a second middle voltage; and
a second level shifter, coupled to the first level shifter and converting the second control voltage into a third control voltage during the voltage conversion period to control a next stage circuit, wherein the third control voltage is between the first middle voltage and a third voltage,
wherein the first level shifter detects the third voltage and generates a plurality of middle voltages based on a detection result, the middle voltages comprise the first middle voltage, the second middle voltage, and a third middle voltage, and the second level shifter generates the third control voltage based on the middle voltages.

2. The level conversion circuit according to claim 1, wherein the voltage conversion period comprises a first conversion period, and the third voltage is greater than or equal to a threshold level during the first conversion period.

3. The level conversion circuit according to claim 2, wherein during the first conversion period, the third middle voltage remains substantially the same, the first middle voltage remains substantially the same or gradually rises or drops in response to the third voltage, and the second middle voltage gradually rises or drops in response to the third voltage.

4. The level conversion circuit according to claim 2, wherein during the first conversion period, the first middle voltage is greater than the second middle voltage, and the second middle voltage is greater than the third voltage.

5. The level conversion circuit according to claim 1, wherein the voltage conversion period comprises a second conversion period, and the third voltage is less than the threshold level and greater than a rated voltage level during the second conversion period.

6. The level conversion circuit according to claim 5, wherein during the second conversion period, the third middle voltage remains substantially the same, and the first middle voltage and the second middle voltage gradually rise or drop in response to the third voltage.

7. The level conversion circuit according to claim 5, wherein during the second conversion period, the third middle voltage is greater than the first middle voltage, the first middle voltage is greater than the second middle voltage, and the second middle voltage is greater than the third voltage.

8. The level conversion circuit according to claim 1, wherein the voltage conversion period comprises a third conversion period, and the third voltage is converted into a rated voltage level during the third conversion period.

9. The level conversion circuit according to claim 8, wherein during the third conversion period, the first middle voltage, the second middle voltage, and the third middle voltage remain substantially the same.

10. The level conversion circuit according to claim 8, wherein during the third conversion period, the third middle voltage is greater than the first middle voltage, the first middle voltage is greater than the second middle voltage, and the second middle voltage is greater than the third voltage.

11. The level conversion circuit according to claim 1, wherein a difference between the third middle voltage and the second middle voltage is less than a withstanding voltage bearable for the level conversion circuit, and a difference between the first middle voltage and the third voltage is less than the withstanding voltage bearable for the level conversion circuit.

12. The level conversion circuit according to claim 1, wherein the first level shifter comprises:
a first voltage generating circuit, generating the third middle voltage based on the first voltage and the second voltage;
a voltage detecting circuit, coupled to the first voltage generating circuit to detect the third voltage so as to generate the detection result, wherein the voltage detecting circuit generates the first middle voltage based on the third middle voltage and the detection result in cooperation with the first voltage generating circuit; and a second voltage generating circuit, coupled to the first voltage generating circuit to generate the second middle voltage based on the first middle voltage and the third voltage.

13. The level conversion circuit according to claim 1, wherein the first voltage is greater than the second voltage, and the second voltage is greater than the third voltage.

14. A voltage level conversion method adaptable for a level conversion circuit, the voltage level conversion method comprising:
converting a first control voltage into a second control voltage during a voltage conversion period, wherein the first control voltage is between a first voltage and a second voltage, the second control voltage is between a first middle voltage and a second middle voltage; and
converting the second control voltage into a third control voltage during the voltage conversion period to control a next stage circuit of the level conversion circuit, wherein the third control voltage is between the first middle voltage and a third voltage,
wherein before the step of converting the second control voltage into the third control voltage, the voltage level conversion method further comprises:
detecting the third voltage to generate a plurality of middle voltages based on a detection result, wherein the middle voltages comprises the first middle voltage, the second middle voltage and a third middle voltage; and
in the step of converting the second control voltage into the third control voltage, the third control voltage is generated based on the middle voltages.

15. The voltage level conversion method according to claim 14, wherein the voltage conversion period comprises a first conversion period, during the first conversion period, the third voltage is greater than or equal to a threshold level, the third middle voltage remains substantially the same, the first middle voltage remains substantially the same or gradually rises or drops in response to the third voltage, the second middle voltage gradually rises or drops in response to the third voltage, the first middle voltage is greater than the second middle voltage, and the second middle voltage is greater than the third voltage.

16. The voltage level conversion method according to claim 14, wherein the voltage conversion period comprises a second conversion period, during the second conversion period, the third voltage is less than the threshold level and greater than a rated voltage level, the third middle voltage remains substantially the same, and the first middle voltage and the second middle voltage gradually rise or drop in response to the third voltage, the third middle voltage is greater than the first middle voltage, the first middle voltage is greater than the second middle voltage, and the second middle voltage is greater than the third voltage.

17. The voltage level conversion method according to claim 14, wherein the voltage conversion period comprises a third conversion period, during the third conversion period, the third voltage is converted into a rated voltage level, and the first middle voltage, the second middle voltage, and the third middle voltage remain substantially the same, the third middle voltage is greater than the first middle voltage, the first middle voltage is greater than the second middle voltage, and the second middle voltage is greater than the third voltage.

18. The voltage level conversion method according to claim 14, wherein a difference between the third middle voltage and the second middle voltage is less than a withstanding voltage bearable for the level conversion circuit, and a difference between the first middle voltage and the third voltage is less than the withstanding voltage bearable for the level conversion circuit.

19. The voltage level conversion method according to claim 14, wherein the first voltage is greater than the second voltage, and the second voltage is greater than the third voltage.

* * * * *